US009153518B2

(12) United States Patent
Tan et al.

(10) Patent No.: US 9,153,518 B2
(45) Date of Patent: Oct. 6, 2015

(54) MOLDED SEMICONDUCTOR PACKAGE WITH PLUGGABLE LEAD

(71) Applicant: Infineon Technologies AG, Neubiberg (DE)

(72) Inventors: Tian San Tan, Melaka (MY); Theng Chao Long, Melaka (MY); Teck Siang Hee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/015,626

(22) Filed: Aug. 30, 2013

(65) Prior Publication Data

US 2015/0061140 A1    Mar. 5, 2015

(51) Int. Cl.
| H01L 23/32 | (2006.01) |
| H01L 23/48 | (2006.01) |
| H01L 23/057 | (2006.01) |
| H01L 23/28 | (2006.01) |
| H01L 23/00 | (2006.01) |
| H01L 23/16 | (2006.01) |
| H01L 23/31 | (2006.01) |

(52) U.S. Cl.
CPC .............. *H01L 23/32* (2013.01); *H01L 23/057* (2013.01); *H01L 23/16* (2013.01); *H01L 23/28* (2013.01); *H01L 23/3107* (2013.01); *H01L 23/48* (2013.01); *H01L 24/42* (2013.01); *H01L 2224/48091* (2013.01); *H01L 2224/73265* (2013.01); *H01L 2924/1305* (2013.01); *H01L 2924/13055* (2013.01); *H01L 2924/13091* (2013.01)

(58) Field of Classification Search
CPC ......... H01L 23/28; H01L 23/31; H01L 23/32; H01L 23/48; H01L 23/04; H01L 23/057; H01L 23/10
USPC ......... 257/678, 690, 698, 707, 730, 773, 786, 257/787, E23.007, E23.01, E23.023, 257/E23.024, E23.07, E23.078
See application file for complete search history.

(56) References Cited

U.S. PATENT DOCUMENTS

| 2007/0012942 A1* | 1/2007 | Wu ................................ 257/100 |
| 2007/0096132 A1* | 5/2007 | Wu ................................. 257/99 |
| 2007/0293088 A1* | 12/2007 | Hiew et al. .................... 439/610 |
| 2009/0051036 A1* | 2/2009 | Abbott ........................... 257/762 |
| 2012/0098117 A1* | 4/2012 | Sato et al. ...................... 257/707 |
| 2013/0126934 A1* | 5/2013 | Chung et al. ..................... 257/99 |

* cited by examiner

*Primary Examiner* — Eduardo A Rodela
(74) *Attorney, Agent, or Firm* — Murphy, Bilak & Homiller, PLLC (57) ABSTRACT

A semiconductor package includes a semiconductor die having a plurality of terminals, a molding compound encapsulating the semiconductor die, and a pluggable lead dimensioned for insertion into an external receptacle. The pluggable lead protrudes from the molding compound and provides a separate electrical pathway for more than one terminal of the semiconductor die. The separate electrical pathways of the pluggable lead can be provided by electrical conductors isolated from one another by electrical insulator such as molding compound or other insulation material/medium.

15 Claims, 12 Drawing Sheets

MOLDED SEMICONDUCTOR PACKAGE WITH PLUGGABLE LEAD

TECHNICAL FIELD

The present application relates to semiconductor packages, in particular the lead configuration for molded semiconductor packages.

BACKGROUND

Power semiconductor transistor packages typically include a power transistor die encapsulated by a molding compound, and three leads protruding from the molding compound. Each lead is electrically connected to a different terminal (e.g. source, gate and drain) of the transistor die, and collectively provide the necessary external electrical connections for the transistor die. Fabricating power semiconductor transistor packages to include a physically separate lead for each terminal of a molded power transistor die increases the size and cost of the package. Also, the leads of a conventional power semiconductor transistor package are typically soldered to another component such as a circuit board. Many hardened applications require solder-less connections, limiting the use of conventional power semiconductor transistor packages to applications in which soldering of the leads is permitted.

SUMMARY

According to an embodiment of a semiconductor package, the semiconductor package comprises a semiconductor die having a plurality of terminals, a molding compound encapsulating the semiconductor die, and a pluggable lead dimensioned for insertion into an external receptacle. The pluggable lead protrudes from the molding compound and provides a separate electrical pathway for more than one terminal of the semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a molded semiconductor package with a pluggable lead. The pluggable lead is dimensioned for insertion into an external receptacle e.g. on a circuit board. Even though the lead is pluggable, the lead can be soldered if desired but soldering is not required to form a reliable connection with the lead. The pluggable lead provides a separate electrical pathway for more than one terminal of a semiconductor die included in the molded package. For example in the case of a transistor die, the pluggable lead can provide an electrical pathway for the drain, source and gate terminals of the transistor die. In the case of a diode die, the pluggable lead can provide an electrical pathway for the anode and cathode terminals of the transistor die. In general, the lead can have any desired cross-sectional shape and the electrical connections between the lead and the terminals of the molded semiconductor die can be realized in different ways as described later herein in more detail.

Figure 1A:
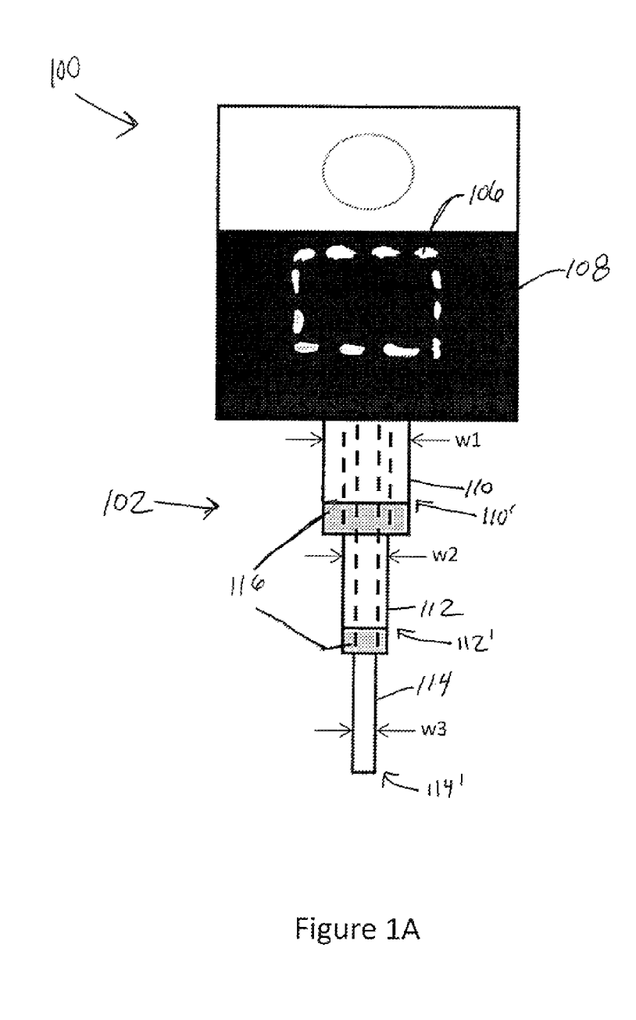
FIG. 1A illustrates a plan view of an embodiment of a molded semiconductor package having a pluggable lead.
Figure 1B:
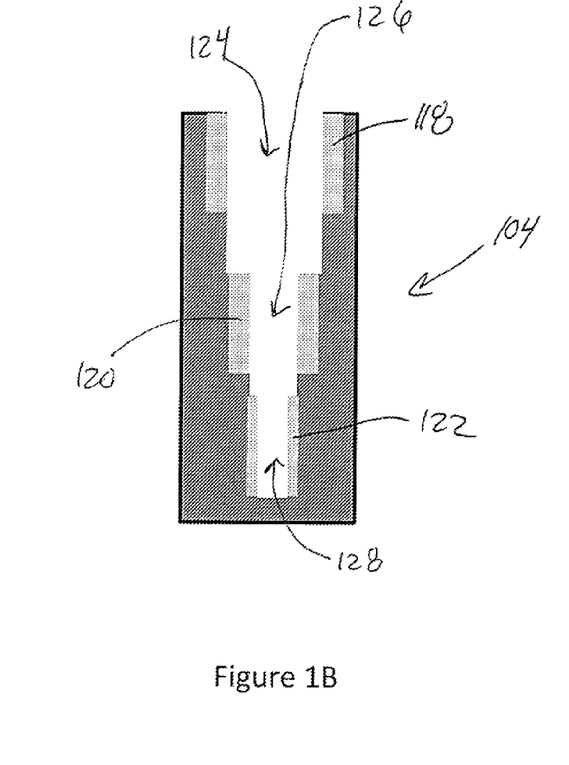
FIG. 1B illustrates a sectional view of a receptacle dimensioned to receive the pluggable lead shown in FIG. 1A.

FIG. 1, which includes FIGS. 1A and 1B, illustrates an embodiment of a molded semiconductor package 100 that includes a pluggable lead 102 dimensioned for insertion into an external receptacle 104. FIG. 1A shows a plan view of the pluggable lead 102 and FIG. 1B shows a cross-sectional view of the receptacle 104. The receptacle 104 is external to the package 100 and can be attached to any desired component such as a circuit board, substrate, card, etc. The receptacle 104 is dimensioned complimentary to the pluggable lead 102, to securely receive the lead 102.

In addition to the pluggable lead 102, the package 100 also includes a semiconductor die 106 having a plurality of terminals (not shown in FIG. 1A) and a molding compound 108 encapsulating the semiconductor die 106. The semiconductor die 106 is illustrated as a dashed box in FIG. 1A since the molding compound 108 surrounds the die 106. The pluggable lead 102 protrudes from the molding compound 108 and provides a separate electrical pathway for more than one terminal of the semiconductor die 106. In one embodiment, the pluggable lead 102 is the only lead electrically connected to the semiconductor die 106 and provides a separate electrical pathway for each terminal of the die 106. For example in the case of a transistor die 106, the pluggable lead 102 can provide separate electrical pathways for the drain, source and gate terminals of the transistor die 106. In the case of a diode die 106, the pluggable lead 102 can provide separate electrical pathways for the anode and cathode terminals of the transistor die 106.

In some cases, the semiconductor die 106 embedded in the molding compound 108 is a vertical transistor die in that current flows through the semiconductor material between the front and back sides of the die 106. For example, the source and gate terminals of the transistor can be disposed at one side of the die 106 and the drain terminal at the backside of the die 106. The term 'source terminal' as used herein refers to the source terminal of an FET (field effect transistor) such as a MOSFET (metal oxide semiconductor FET) or GaN HEMT (high electron mobility transistor), or the emitter terminal of a bipolar transistor such as an IGBT (insulated gate bipolar transistor). Likewise, the term 'drain terminal' as used herein refers to the drain terminal of an FET or the collector terminal of a bipolar transistor. More than one semiconductor die 106 can be included in the molded package 100 e.g. in the case of a half-bridge circuit or a GaN HEMT die connected anti-parallel to a separate diode die.

In each case, the electrical pathways of the pluggable lead 102 are formed by electrical conductors 110, 112, 114 that are isolated from one another by an electrical insulator 116. The pluggable lead 102 shown in FIG. 1 comprises a first electrical conductor 110 protruding from the molding compound 108 and electrically connected to a first terminal of the semiconductor die 106, a second electrical conductor 112 protruding from the molding compound 108 and electrically connected to a second terminal of the semiconductor die 106, and an electrical insulator 116 isolating the first and second electrical conductors 110, 112 from one another. The semiconductor die 106 shown in FIG. 1 is a transistor die and the pluggable lead 102 further comprises a third electrical conductor 114 protruding from the molding compound 108 and electrically connected to a third terminal of the semiconductor die 106.

The electrical conductors 110, 112, 114 of the pluggable lead 102 are dimensioned to contact corresponding conductive regions 118, 120, 122 of the external receptacle 104 upon insertion of the lead 102 into the receptacle 104. The points of contact between the electrical conductors 110, 112, 114 of the pluggable lead 102 and the corresponding conductive regions 118, 120, 122 of the external receptacle 104 can be soldered or solder-less (e.g. press-fit or so-called poka-yoke connection). In one embodiment, the electrical insulator 116 that isolates the electrical conductors 110, 112, 114 of the pluggable lead 102 from one another is a molding compound. The same or different type of molding compound can be used to isolate the electrical conductors 110, 112, 114 of the pluggable lead 102 as the molding compound 108 that encapsulates the semiconductor die 106.

Further according to the embodiment shown in FIG. 1, the second electrical conductor 112 of the pluggable lead 102 is partly disposed in and isolated from the first electrical conductor 110 of the lead 102. The third electrical conductor 114 of the pluggable lead 102 is similarly partly disposed in and isolated from the second electrical conductor 112 of the lead 102. Also, the second electrical conductor 112 protrudes further outward from the molding compound 108 than the first electrical conductor 110 and the third electrical conductor 114 protrudes further outward from the molding compound 108 than the second electrical conductor 112.

Each of the electrical conductors 110, 112, 114 of the pluggable lead 102 has a distal end 110', 112', 114' that remains uncovered by the molding compound 108. The width (w1) of the distal end 110' of the first electrical conductor 110 is greater than the width (w2) of the distal end 112' of the second electrical conductor 112 so that the second electrical conductor 112 can fit inside the first electrical conductor 110 as indicated by the more widely spaced set of dashed lines in FIG. 1A. The width (w2) of the distal end 112' of the second electrical conductor 112 is greater than the width (w3) of the distal end 114' of the third electrical conductor 114 so that the third electrical conductor 114 can fit inside the second electrical conductor 112 as indicated by the more closely spaced set of dashed lines in FIG. 1A. The external receptacle 104 has a shape complimentary to that of the pluggable lead 102, so that the different width parts of the pluggable lead 102 are received securely within correspondingly sized open regions 124, 126, 128 of the receptacle 104.

Figure 2:
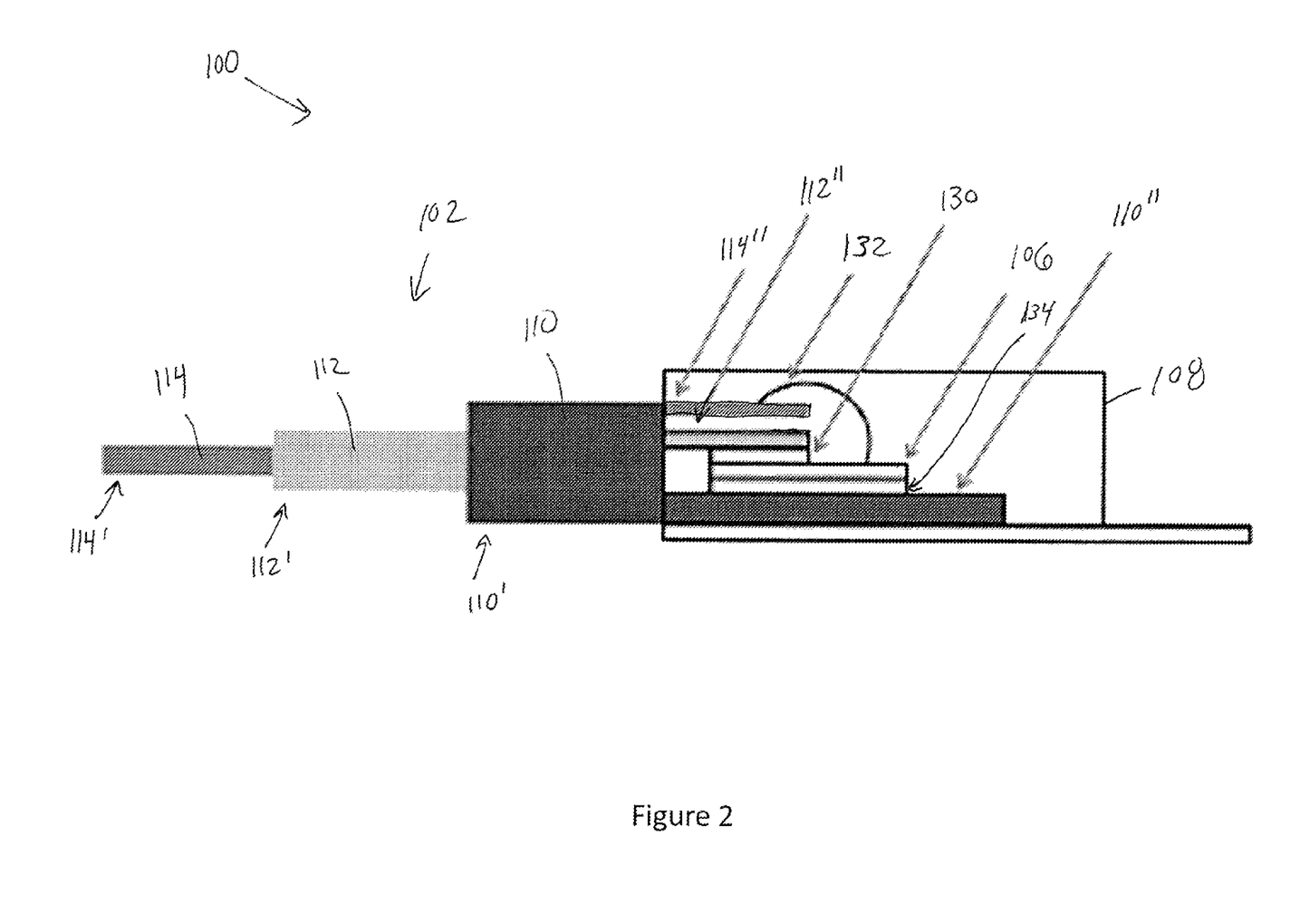
FIG. 2 illustrates a cross-sectional view of another embodiment of a molded semiconductor package having a pluggable lead.

FIG. 2 illustrates a cross-sectional view of the molded package 100 of FIG. 1, according to an embodiment. In this embodiment, each electrical conductor 110, 112, 114 of the pluggable lead 102 has a curved, edged or shaped distal end 110', 112', 114' outside the molding compound 108 and a flat proximal end 110", 112", 114" inside the molding compound 108. The electrical conductors 110, 112, 114 can be shaped by stamping or any other suitable process to yield the desired shape within and outside the molding compound 108. The flat proximal end 110" of the first electrical conductor 110 is spaced apart from the flat proximal ends 112", 114" of the second and third electrical conductors 112, 114 and from the semiconductor die 106. Also according to this embodiment, the flat proximal end 112" of the second electrical conductor 112 and the flat proximal end 114" of the third electrical conductor 114 terminate at the same point within the molding compound 108, with the third electrical conductor 114 being disposed above the second electrical conductor 112 in the molding compound 108. The flat proximal end 112" of the second electrical conductor 112 extends over and is attached to a terminal e.g. a source terminal of a transistor die 106 at the top side of the die 106 by solder paste or other electrically conductive attach material 130. The third electrical conductor 114 is electrically connected to a different terminal e.g. a gate terminal of a transistor die 106 at the top side of the die 106 by one or more bond wires 132. In the case of a vertical device, the semiconductor die 106 is disposed on the flat proximal end 110" of the first electrical conductor 110 at the bottom side of the die 106. A terminal e.g. a drain terminal of a transistor die 106 disposed at the bottom side of the die 106 is attached to the flat proximal end 110" of the first electrical conductor 110 by solder paste or other electrically conductive attach material 134. According to this embodiment, the flat proximal end 110" of the first electrical conductor 110 functions as a die paddle and eliminates the need for a separate die paddle.

Figure 3:
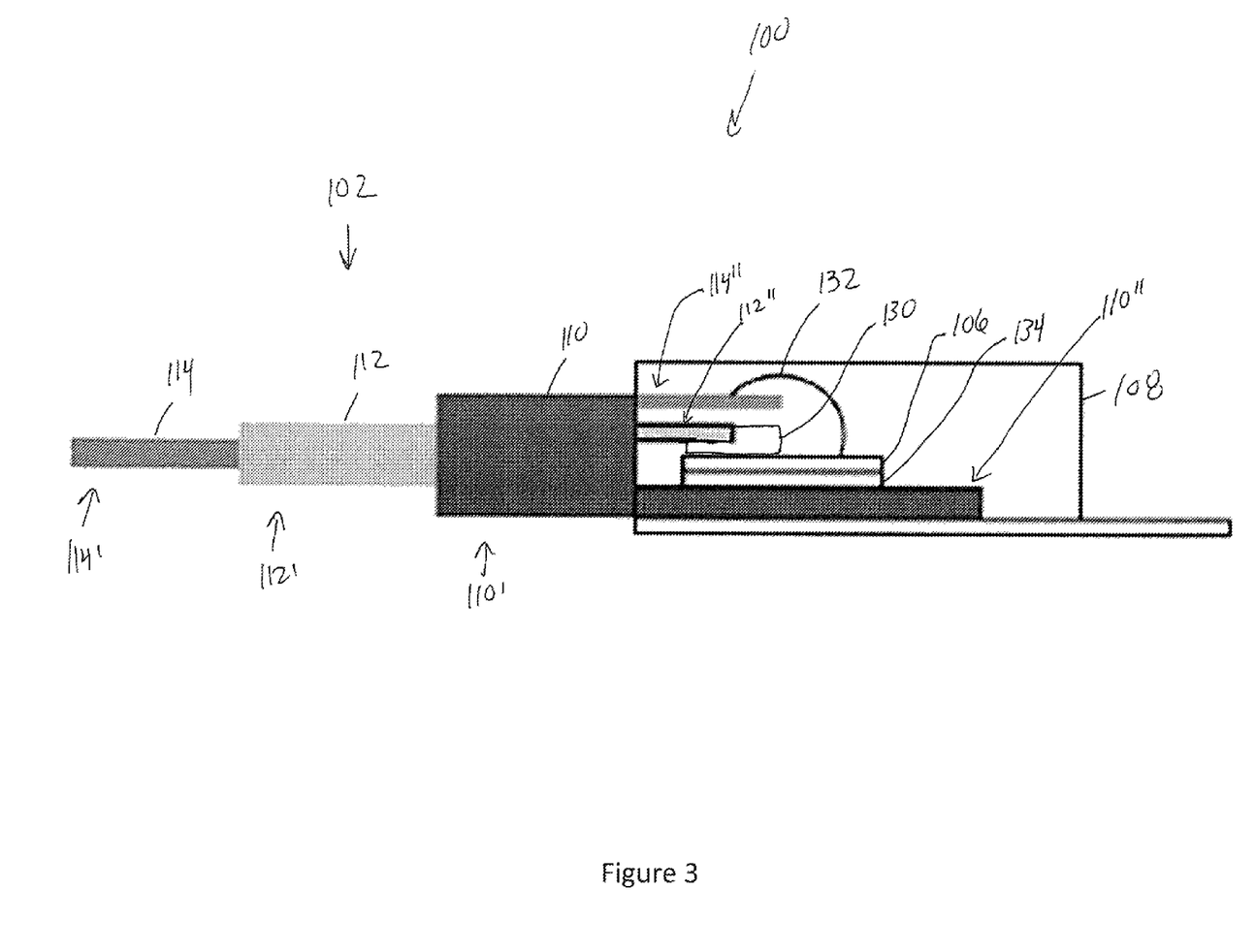
FIG. 3 illustrates a cross-sectional view of yet another embodiment of a molded semiconductor package having a pluggable lead.

FIG. 3 illustrates a cross-sectional view of the molded package 100 of FIG. 1, according to another embodiment. The embodiment shown in FIG. 3 is similar to the embodiment shown in FIG. 2, however, the flat proximal end 114" of the third electrical conductor 114 of the pluggable lead 102 extends further into the molding compound 108 than the flat proximal end 112" of the second electrical conductor 112 of the lead 102.

Figure 4:
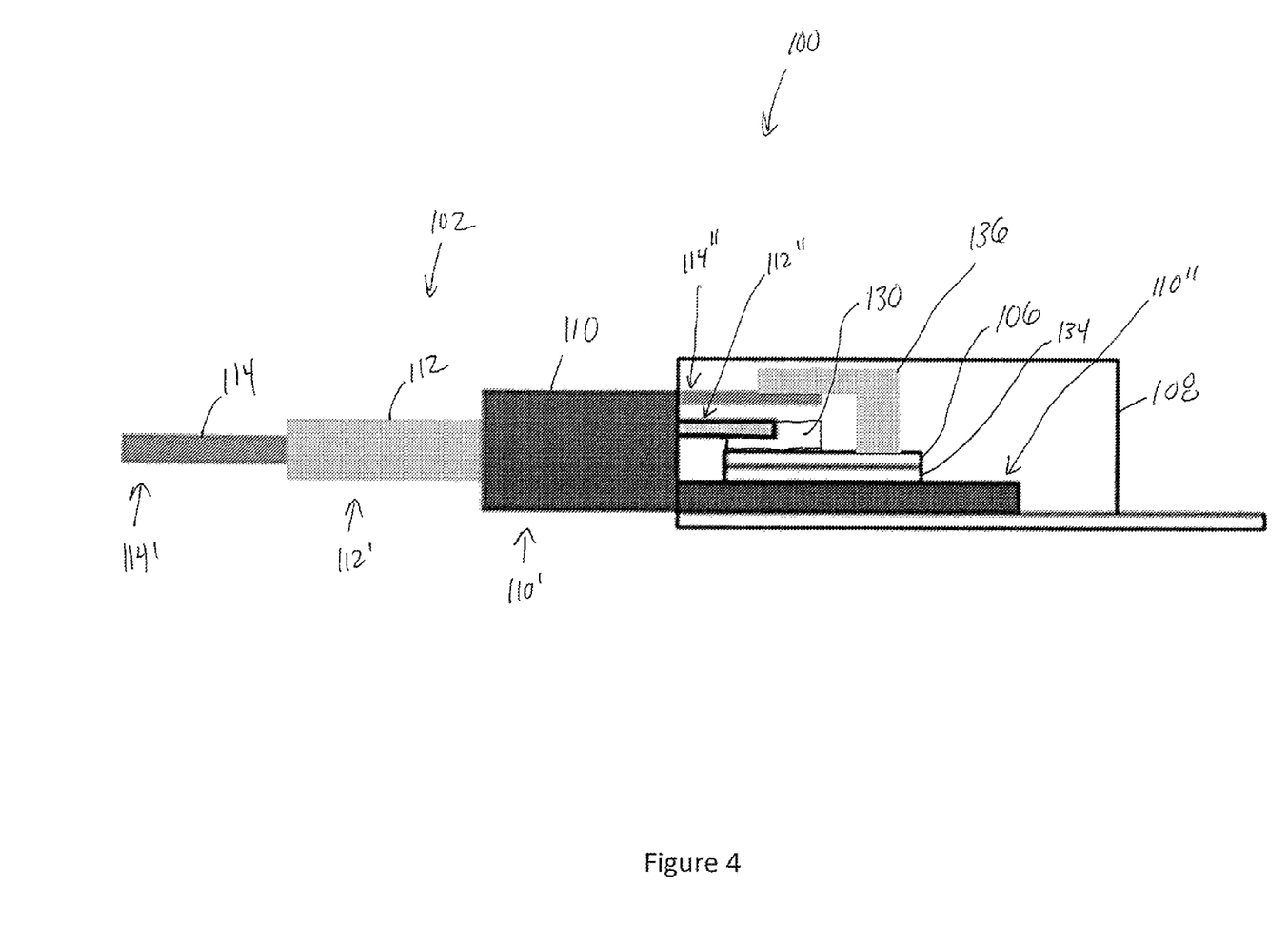
FIG. 4 illustrates a cross-sectional view of still another embodiment of a molded semiconductor package having a pluggable lead.

FIG. 4 illustrates a cross-sectional view of the molded package 100 of FIG. 1, according to yet another embodiment. The embodiment shown in FIG. 4 is similar to the embodiment shown in FIG. 3, however, the third electrical conductor 114 is electrically connected to the corresponding terminal at the top side of the semiconductor die 106 by a metal clip 136 instead of bond wires 132. The top side of the metal clip 136 i.e. the side facing away from the die 106 can be exposed in some cases. That is, the top side of the metal clip 136 is not necessarily covered by the molding compound 108.

Figure 5A:
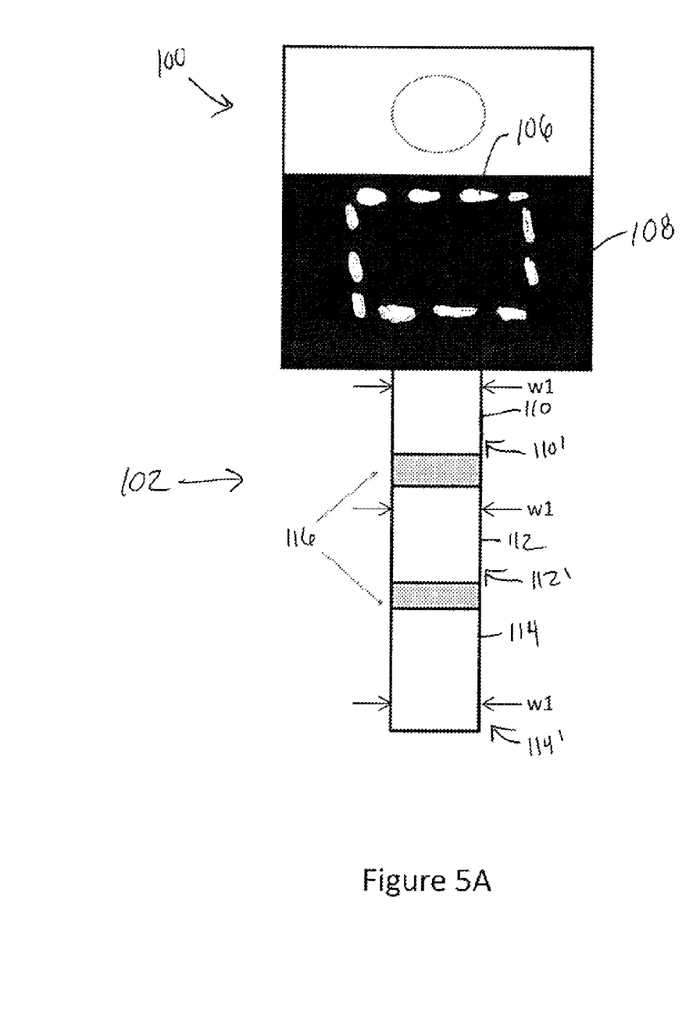
FIG. 5A illustrates a plan view of an embodiment of a molded semiconductor package having a pluggable lead.
Figure 5B:
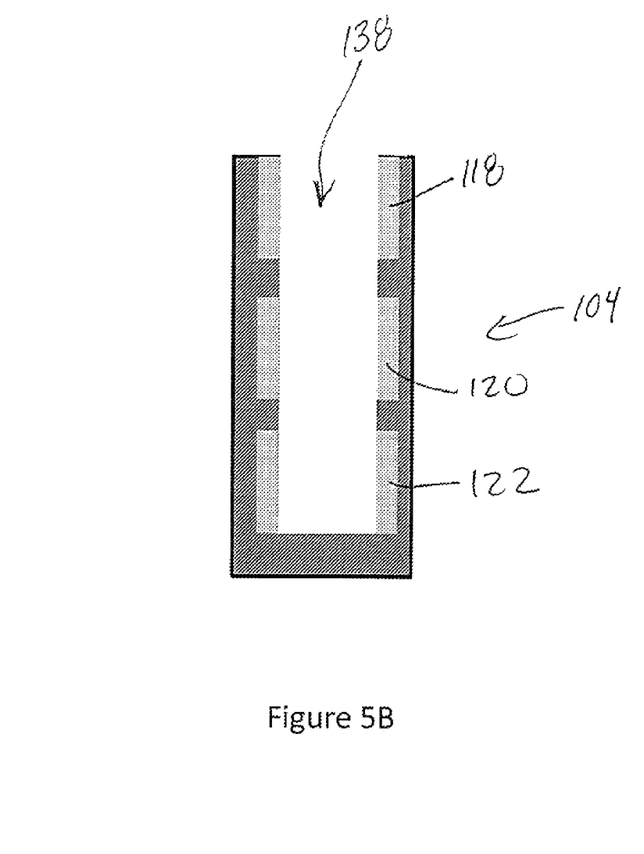
FIG. 5B illustrates a sectional view of a receptacle dimensioned to receive the pluggable lead shown in FIG. 5A.

FIG. 5, which includes FIGS. 5A and 5B, illustrates another embodiment of a molded semiconductor package 100 that includes a pluggable lead 102 dimensioned for insertion into an external receptacle 104. FIG. 5A shows a plan view of the lead 102 and FIG. 5B shows a cross-sectional view of the receptacle 104. The pluggable lead 102 and receptacle 104 shown in FIG. 5 are similar to the lead 102 and receptacle 104 shown in FIG. 1, respectively, however the distal end 110', 112', 114' of each electrical conductor 110, 112, 114 of the pluggable lead 102 are of the same width (w1). The receptacle 104 is dimensioned complimentarily to the pluggable lead 102, so that the uniform width parts of the pluggable lead 102 are received securely within a uniformly sized open region 138 of the receptacle 104.

Figures 6A, 6B, 6C:
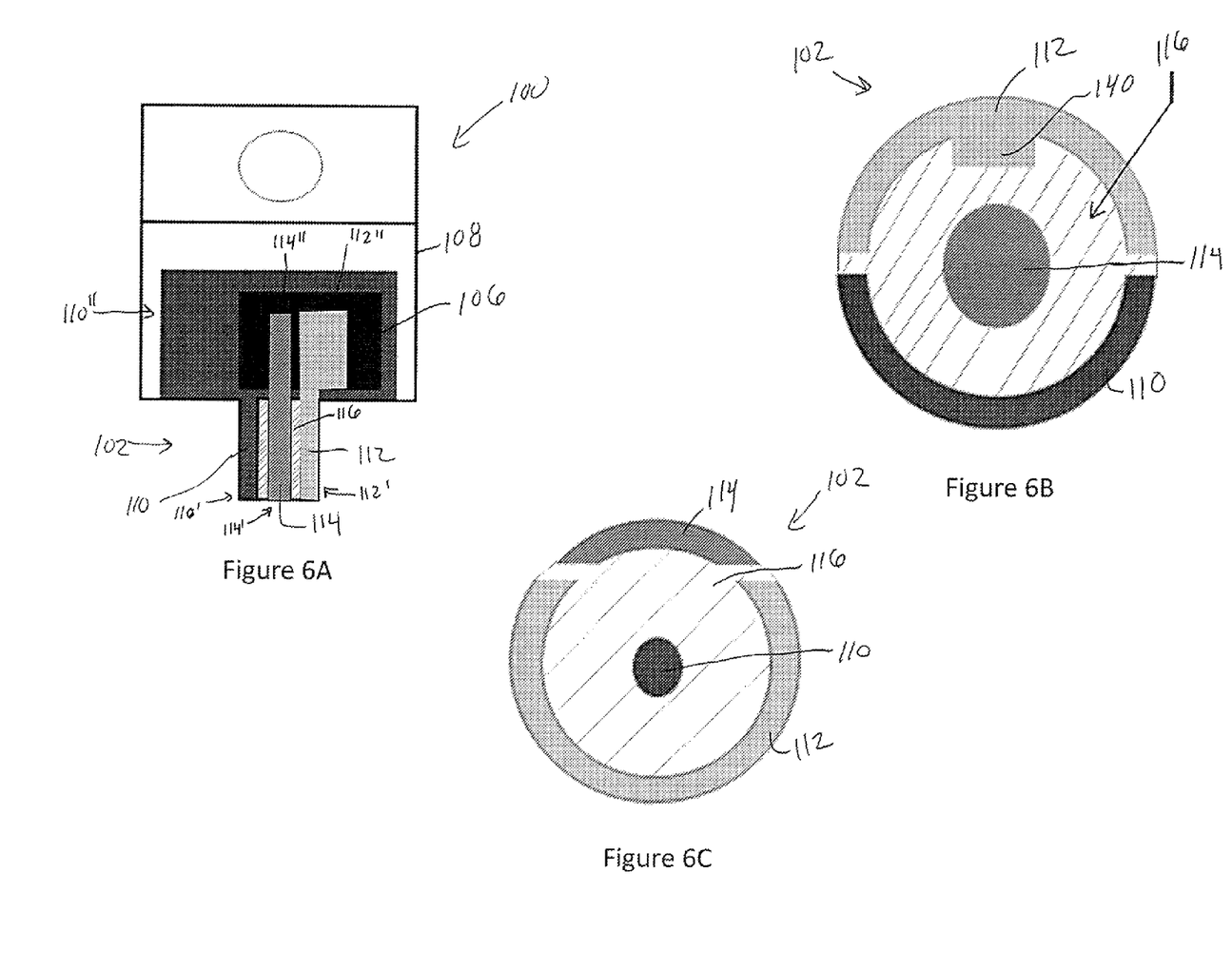
FIGS. 6A through 6C illustrate different views of another embodiment of a molded semiconductor package having a pluggable lead.

FIG. 6, which includes FIGS. 6A through 6C, illustrates yet another embodiment of a molded semiconductor package 100 that includes a pluggable lead 102 dimensioned for insertion into an external receptacle 104. FIG. 6A shows a sectional view of the package 100 along a plane parallel to the top side of the package 100 so that the view of the lead conductors 110, 112, 114 and the semiconductor die 106 is unobstructed by the molding compound 108. FIG. 6B shows a cross-sectional view of the pluggable lead 102 according to a first embodiment and FIG. 6C shows a cross-sectional view of the pluggable lead 102 according to a second embodiment. The pluggable lead 102 has an elongated tubular shape along a length of the lead 102 as shown in FIG. 6A, and a round or circular cross-sectional shape as shown in FIGS. 6B and 6C.

Each electrical conductor 110, 112, 114 of the pluggable lead 102 has a curved distal end 110', 112', 114' protruding from the molding compound 108 as shown in FIGS. 6B and 6C, and a flat proximal end 110", 112", 114" disposed inside the molding compound 108 as shown in FIG. 6A. The electrical conductors 110, 112, 114 can be shaped in this way by stamping or any other suitable process as previously explained herein.

In the case of a vertical device, the semiconductor die 106 is disposed on the flat proximal end 110" of the first electrical conductor 110 at the bottom side of the die 106. A terminal e.g. a drain terminal of a transistor die 106 disposed at the bottom side of the die 106 is attached to the flat proximal end 110" of the first electrical conductor 110 by a solder paste or other electrically conductive attach material (not visible in FIG. 6). The flat proximal end 110" of the first electrical conductor 110 functions as a die paddle according to this embodiment and eliminates the need for a separate die paddle as previously described herein. The second and third electrical conductors 112, 114 are disposed above the semiconductor die 106, within the molding compound 108. According to this embodiment, the second and third electrical conductors 112, 114 are attached to respective terminals at the top side of the semiconductor die 106 by solder paste or other electrically conductive attach material (not visible in FIG. 6). Bond wires or metal clips are not required to complete the electrical connection between the electrical conductors 110, 112, 114 of the pluggable lead 102 and the respective terminals of the semiconductor die 106. Instead, the electrical conductors 110, 112, 114 are attached to the corresponding terminals of the semiconductor die 106.

According to the embodiment of FIG. 6B, the distal end 110' of the first electrical conductor 110 of the pluggable lead 102 has a curved cross-sectional shape and is disposed at the bottom of the lead 102. The distal end 112' of the second electrical conductor 112 similarly has a curved cross-sectional shape and is disposed at the top of the lead 102. The first and second electrical conductors 110, 112 can be the same or different sizes, and form an enclosure in which the third electrical conductor 114 of the pluggable lead 102 is disposed. The distal end 114' of the third electrical conductor 114 has a circular or oval cross-sectional shape. The electrical conductors 110, 112, 114 are isolated from one another by an electrical insulator 116 such as molding compound or other insulation material/medium. The second electrical conductor 112 can have a tab or protrusion 140 to ensure proper orientation of the lead 102 during insertion into the external receptacle 104.

According to the embodiment of FIG. 6C, the distal end 112' of the second electrical conductor 112 of the pluggable lead 102 has a curved cross-sectional shape and is disposed at the bottom of the lead 102. The distal end 114' of the third electrical conductor 114 also has a curved cross-sectional shape and is disposed at the top of the lead 102. The second electrical conductor 112 has a larger area than the third electrical conductor 114. The first electrical conductor 110 has a circular or oval cross-sectional shape and is disposed in the enclosure formed by the second and third electrical conductors 112, 114. The electrical conductors 110, 112, 114 are isolated from one another by an electrical insulator 116 such as molding compound or other insulation material/medium.

Figure 7:
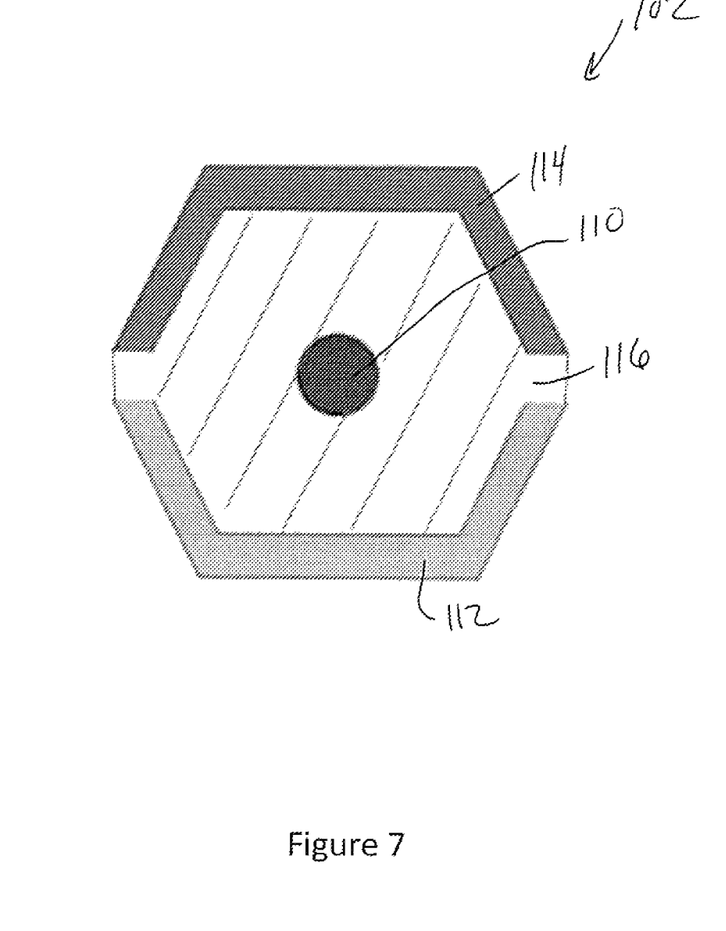
FIG. 7 illustrates a cross-sectional view of an embodiment of a pluggable lead for a molded semiconductor package.

FIG. 7 illustrates a cross-sectional view of another embodiment of the pluggable lead 102. According to this embodiment, the pluggable lead 102 has an octagonal cross-sectional shape. The second electrical conductor 112 of the pluggable lead 102 has an exterior surface with three flat sides at obtuse angles to one another and is disposed at the bottom of the lead 102. The third electrical conductor 114 similarly has an exterior surface with three flat sides at obtuse angles to one another and is disposed at the top of the lead 102. The first electrical conductor 110 has a circular or oval cross-sectional shape and is disposed in an enclosure formed by the second and third electrical conductors 112, 114. The electrical conductors 110, 112, 114 are isolated from one another by an electrical insulator 116 such as molding compound or other insulation material/medium.

Figure 8:
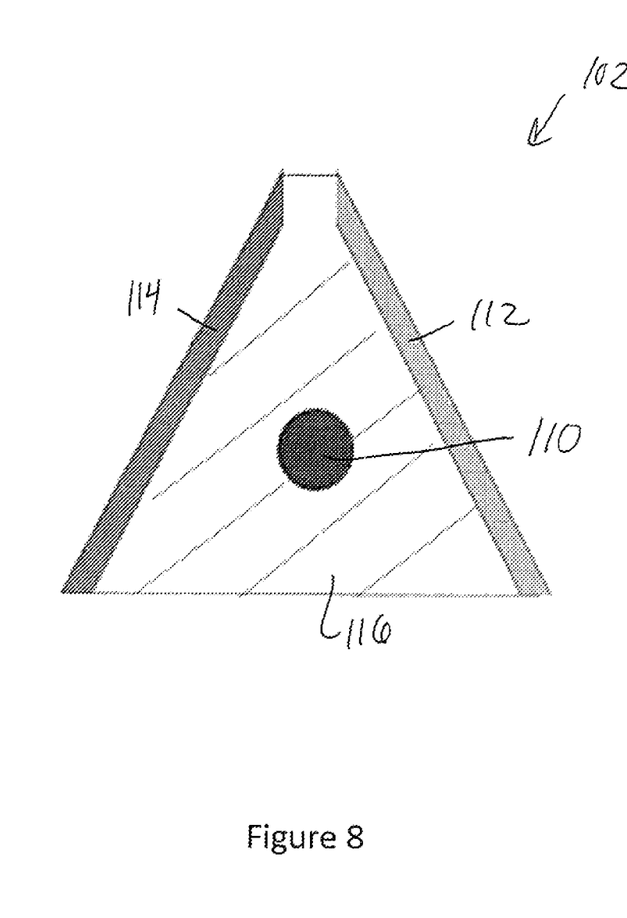
FIG. 8 illustrates a cross-sectional view of another embodiment of a pluggable lead for a molded semiconductor package.

FIG. 8 illustrates a cross-sectional view of yet another embodiment of the pluggable lead 102. According to this embodiment, the pluggable lead 102 has a triangular cross-sectional shape. The second and third electrical conductors 112, 114 of the pluggable lead each have a flat exterior surface and the first electrical conductor 110 has a circular or oval cross-sectional shape and is disposed between the second and third electrical conductors 112, 114. The electrical conductors 110, 112, 114 are isolated from one another by an electrical insulator 116 such as molding compound or other insulation material/medium.

Figure 9:
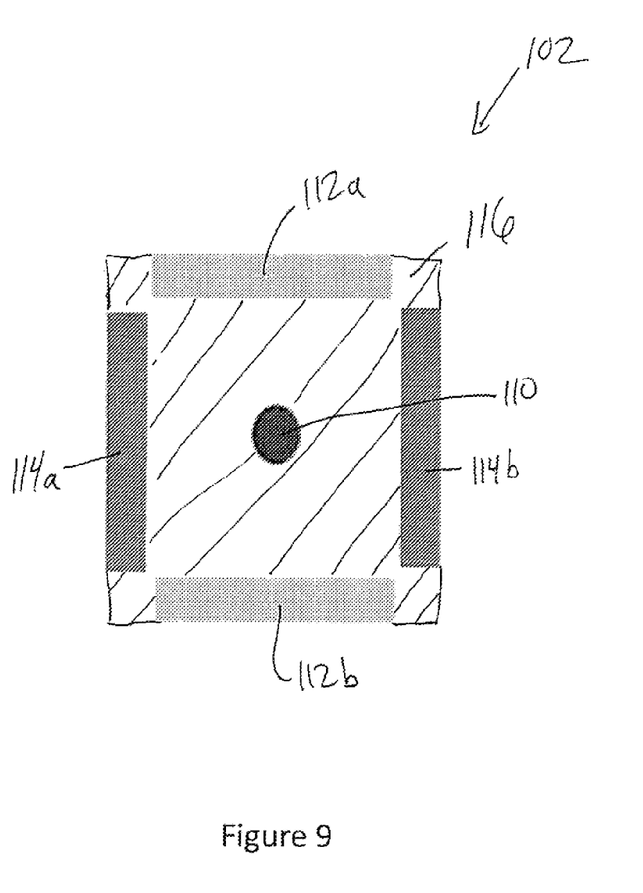
FIG. 9 illustrates a cross-sectional view of yet another embodiment of a pluggable lead for a molded semiconductor package.

FIG. 9 illustrates a cross-sectional view of still another embodiment of the pluggable lead 102. According to this embodiment, the pluggable lead 102 has a square or rectangular cross-sectional shape and includes two second electrical conductors 112a, 112b for electrical connection to a second terminal of a transistor die 106 and two third electrical conductors 114a, 114b for electrical connection to a third terminal of the transistor die 106. The two second electrical conductors 112a, 112b and the two third electrical conductors 114a, 114b form a square or rectangular-shaped enclosure in which the first electrical conductor 110 is disposed. The first electrical conductor 110 is electrically connected to a first terminal of the transistor die 106. The electrical conductors 110, 112a, 112b, 114a, 114b are isolated from one another by an electrical insulator 116 such as molding compound or other insulation material/medium.

Figure 10:
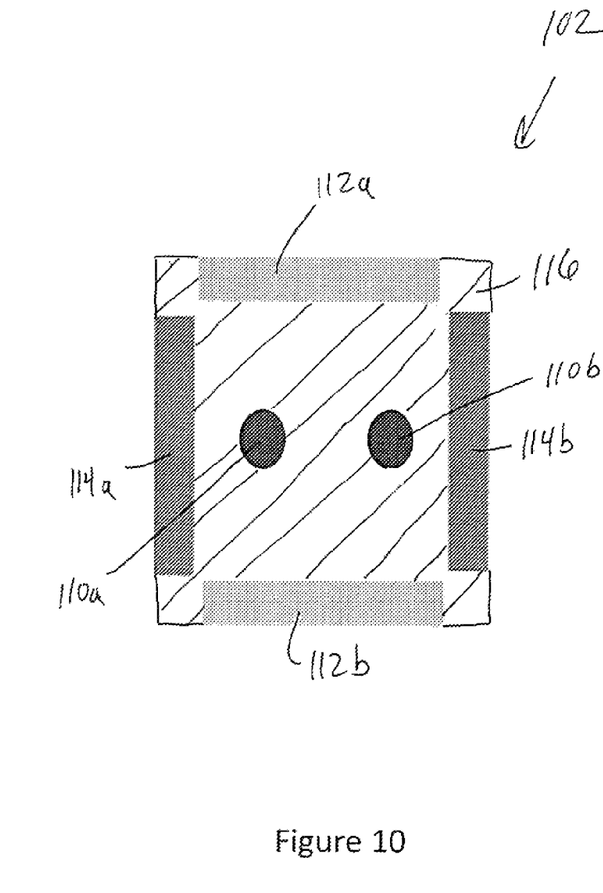
FIG. 10 illustrates a cross-sectional view of an embodiment of a pluggable lead for a molded semiconductor package with more than one semiconductor die.

FIG. 10 illustrates a cross-sectional view of a pluggable lead 102 configured for connection to more than one semiconductor die included in a molded package. For example in the case of a half-bridge circuit which includes a high-side transistor die and a low-side transistor die, the pluggable lead 102 can include a first electrical conductor 112a for electrical connection to the source terminal of the high-side transistor die, a second electrical conductor 112b for electrical connection to the source terminal of the low-side transistor die, a third electrical conductor 114a for electrical connection to the gate terminal of the high-side transistor die, and a fourth electrical conductor 114b for electrical connection to the gate terminal of the low-side transistor die. The first through fourth electrical conductors 112a-114b form a square or rectangular-shaped enclosure in which fifth and sixth electrical conductors 110a, 110b are disposed. The fifth electrical conductor 110a is electrically connected to the drain terminal of the high-side transistor die and the sixth electrical conductor 110b is electrically connected to the drain terminal of the low-side transistor die. The first electrical conductor 112a (electrically connected to the source terminal of the high-side transistor die) or the sixth electrical conductor 110b (electrically connected to the drain terminal of the low-side transistor die) can be omitted in case the source terminal of the high-side transistor die and the drain terminal of the low-side transistor die are connected within the molded package to form the output of the half-bridge circuit. The electrical conductors 110a, 110b, 112a, 112b, 114a, 114b are isolated from one another by an electrical insulator 116 such as molding compound or other insulation material/medium.

Figures 11A, 11B, 11C:
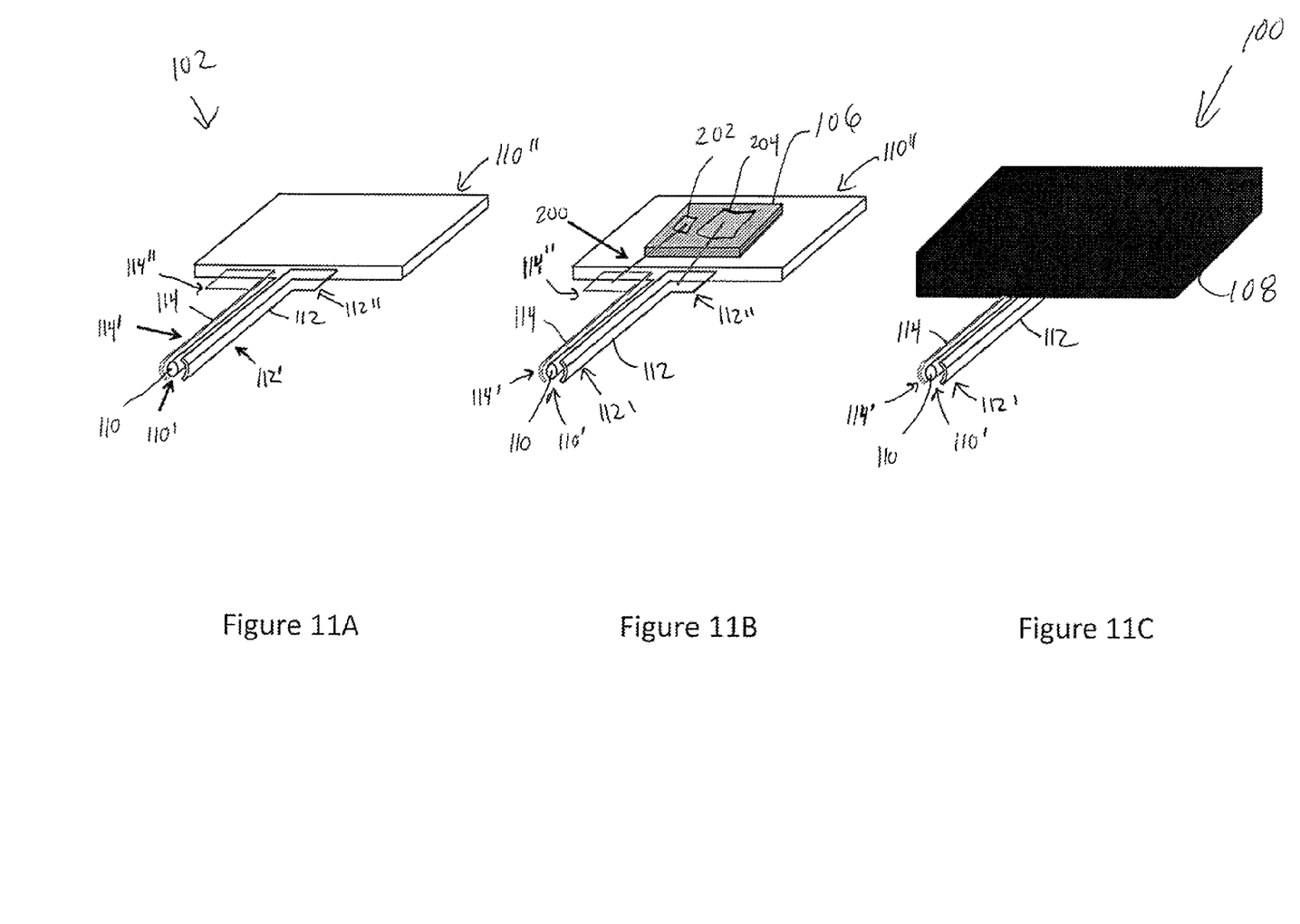
FIGS. 11A through 11C illustrate different stages of a method of manufacturing a molded semiconductor package having a pluggable lead, according to an embodiment.

FIGS. 11A through 11C illustrate an embodiment of manufacturing a molded semiconductor package 100 having a pluggable lead 102. In FIG. 11A, the pluggable lead 102 is provided with three separate electrical conductors 110, 112, 114 isolated from one another by an electrical insulator (not shown) such as molding compound or other insulation material/medium. The two outer electrical conductors 112, 114 form a circular or oval-shaped enclosure in which the inner electrical conductor 110 is disposed. The electrical conductors 110, 112, 114 are stamped or otherwise shaped to have a flat proximal end 110", 112", 114" to be molded and a curved distal end 110', 112', 114' to remain un-molded. As such, the outer surface of each electrical conductor 110, 112, 114 of the pluggable lead 102 faces a different direction in a region outside the molding compound 108 than in a region encapsulated by the molding compound 108.

A vertical transistor die 106 is attached to the flat proximal end 110" of the inner electrical conductor 110 as shown in FIG. 11B e.g. by solder paste or other die attach material (out of view). This connection provides a point of electrical contact between the inner electrical conductor 110 of the pluggable lead 102 and a terminal (out of view) disposed at the bottom side of the transistor die 106. Electrical connections 200 are formed between the outer electrical conductors 112, 114 of the pluggable lead 102 and corresponding terminals 202, 204 disposed at the top side of the transistor die 106. The electrical connections 200 are shown as lines in FIG. 11B, and can be bond wires, ribbon bond, or metal clips. The transistor die 106, proximal ends 110", 112", 114" of the lead conductors 110, 112, 114 and the electrical connections 200 between the die terminals 202, 204 and the lead conductors 110, 112, 114 are then encapsulated by a molding compound 108 as shown in FIG. 11C.

Figure 12A:
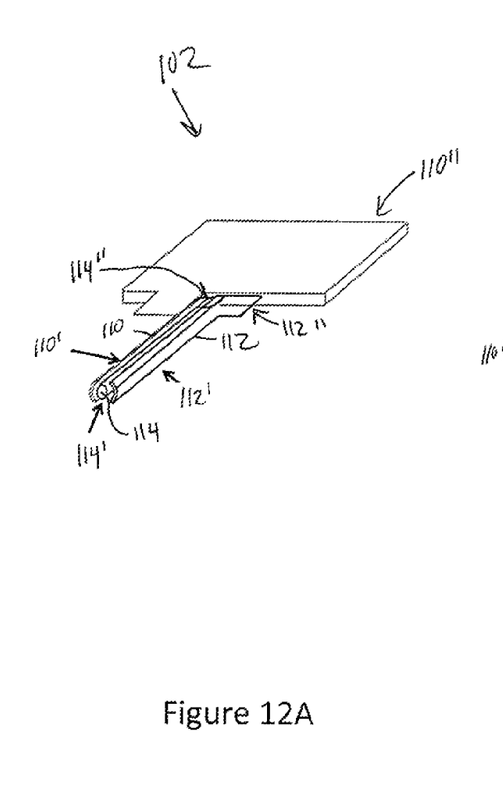
FIGS. 12A through 12C illustrate different stages of a method of manufacturing a molded semiconductor package having a pluggable lead, according to another embodiment.
Figure 12B:
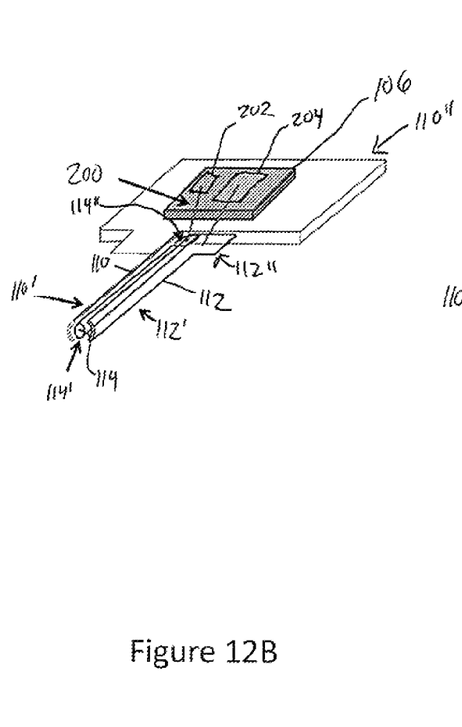
Figure 12C:
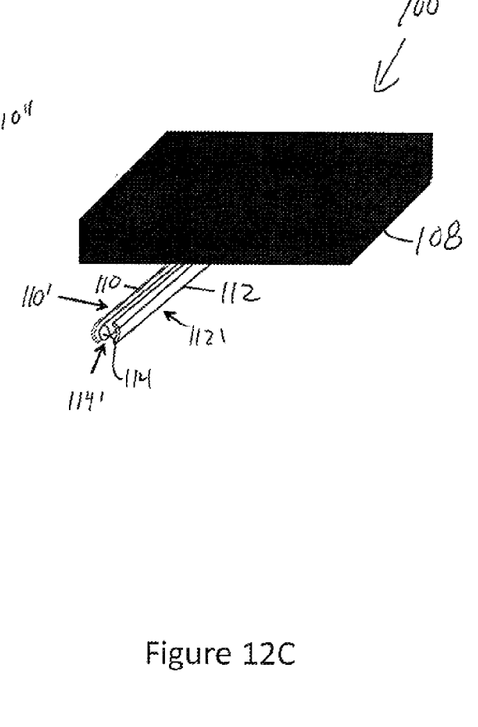

FIGS. 12A through 12C illustrate another embodiment of manufacturing a molded semiconductor package 100 having a pluggable lead 102. The embodiment shown in FIGS. 12A through 12C is similar to the embodiment shown in FIGS. 11A through 11C, however the electrical conductor 110 of the pluggable lead 102 shaped to receive the transistor die 106 is one of the outer conductors 110, 112 of the lead 102 instead of the inner conductor 114.

Figure 13A:
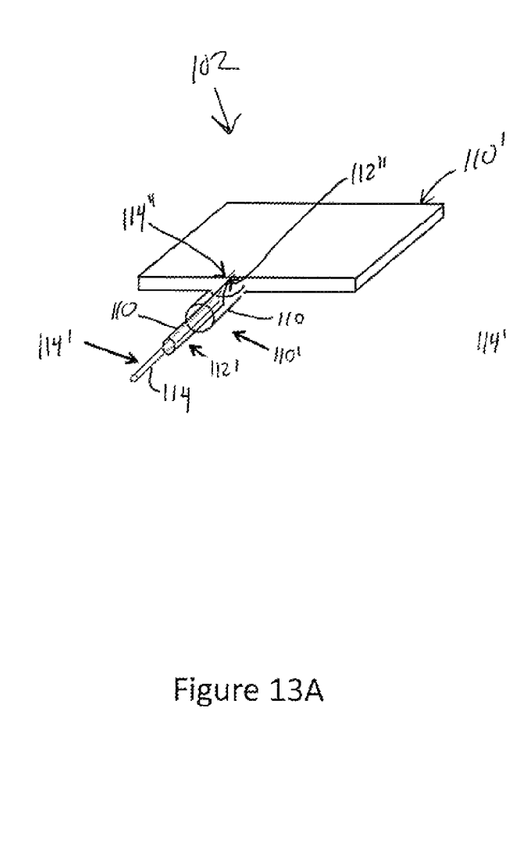
FIGS. 13A through 13C illustrate different stages of a method of manufacturing a molded semiconductor package having a pluggable lead, according to yet another embodiment.
Figure 13B:
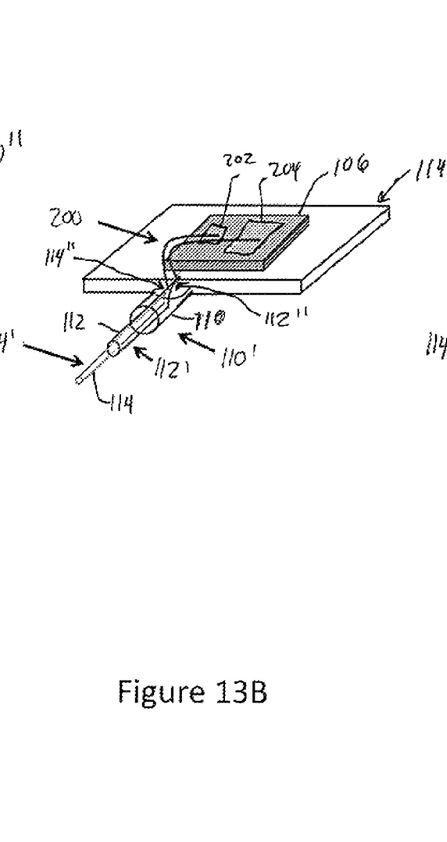
Figure 13C:
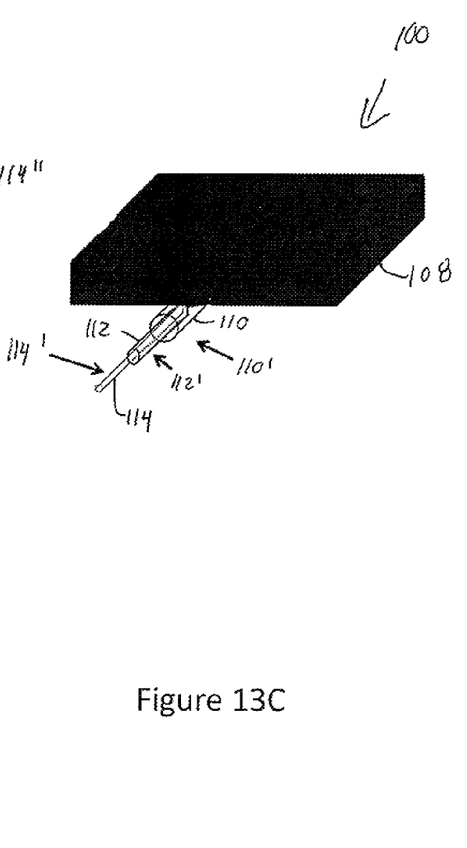

FIGS. 13A through 13C illustrate yet another embodiment of manufacturing a molded semiconductor package 100 having a pluggable lead 102. The embodiment shown in FIGS. 13A through 13C is similar to the embodiment shown in FIGS. 11A through 11C, however the shape of the pluggable lead 102 corresponds to the embodiment shown in FIG. 1A. The outermost, widest electrical conductor 110 of the pluggable lead 102 is shaped e.g. by stamping to receive the transistor die 106.

Figure 14:
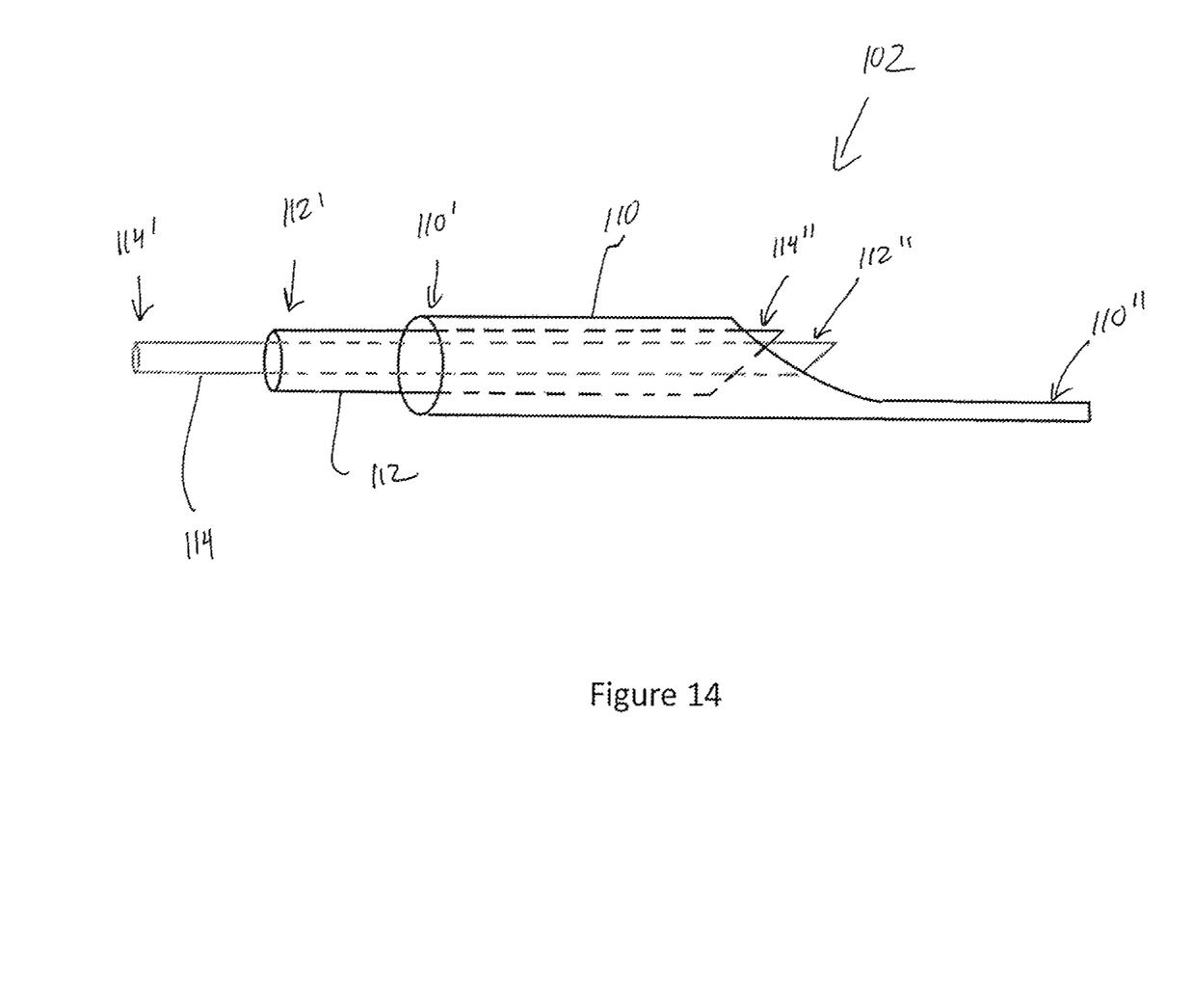
FIG. 14 illustrates a cross-sectional view of the pluggable lead included in the molded semiconductor package manufactured in accordance with the method of FIGS. 13A through 13C.

FIG. 14 shows an enlarged, side perspective view of the pluggable lead 102 illustrated in FIGS. 13A through 13C. The proximal end 110" of the outermost, widest electrical conductor 110 of the pluggable lead 102 i.e. the end to be encapsulated by molding compound 108 can be shaped so that part of the proximal end 112" of the next widest electrical conductor 112 is uncovered by the outermost, widest electrical conductor 110. Similarly, the proximal end 112" of this middle electrical conductor 112 can be shaped so that part of the proximal end 114" of the innermost, narrowest electrical conductor 114 is uncovered by the middle electrical conductor 112. Such a construction of the conductor leads 110, 112, 114 allows for the necessary electrical connections to be made between the middle and innermost electrical conductors 112, 114 of the pluggable lead 102 and the corresponding die terminals 202, 204.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor package, comprising:
a semiconductor die having a plurality of terminals;
a molding compound encapsulating the semiconductor die; and
a pluggable lead dimensioned for insertion into an external receptacle, the pluggable lead protruding from the mold- ing compound and providing a separate electrical pathway for more than one terminal of the semiconductor die, wherein the pluggable lead comprises a first electrical conductor protruding from the molding compound and electrically connected to a first one of the die terminals, a second electrical conductor protruding from the molding compound and electrically connected to a second one of the die terminals, and an electrical insulator isolating the first and second electrical conductors from one another, the first and second electrical conductors dimensioned to contact different regions of the external receptacle upon insertion of the pluggable lead into the receptacle, wherein the semiconductor die is a transistor die having a drain terminal, a source terminal and a gate terminal, wherein the first electrical conductor of the pluggable lead is electrically connected to the drain terminal of the transistor die and the second electrical conductor of the pluggable lead is electrically connected to the source terminal of the transistor die, wherein the pluggable lead further comprises a third electrical conductor electrically connected to the gate terminal of the transistor die and isolated from the first and second electrical conductors of the pluggable lead.

2. A semiconductor package, comprising:

an encapsulated transistor die having a first terminal, a second terminal and a third terminal; and a pluggable lead dimensioned for insertion into an external receptacle, the pluggable lead providing a separate electrical pathway for the terminals of the transistor die, wherein the pluggable lead comprises a first electrical conductor electrically connected to the first terminal of the transistor die, a second electrical conductor electrically connected to the second terminal of the transistor die, a third electrical conductor electrically connected to the third terminal of the transistor die, and an electrical insulator isolating the electrical conductors from one another, the electrical conductors dimensioned to contact different regions of the external receptacle upon insertion of the pluggable lead into the receptacle.

3. The semiconductor package of claim 2, wherein the electrical insulator is a molding compound.

4. The semiconductor package of claim 2, wherein the first electrical conductor of the pluggable lead is electrically connected to the first terminal of the transistor die by one or more bond wires, and the second electrical conductor of the pluggable lead is electrically connected to the second terminal of the transistor die by one or more additional bond wires.

5. The semiconductor package of claim 2, wherein the first electrical conductor of the pluggable lead is electrically connected to the first terminal of the transistor die by a first metal clip, and the second electrical conductor of the pluggable lead is electrically connected to the second terminal of the transistor die by a second metal clip.

6. The semiconductor package of claim 2, wherein an end of the first electrical conductor of the pluggable lead farthest from the transistor die has a different cross-sectional shape than an end of the first electrical conductor closest to the transistor die, and wherein an end of the second electrical conductor of the pluggable lead farthest from the transistor die has a different cross-sectional shape than an end of the second electrical conductor closest to the transistor die.

7. The semiconductor package of claim 2, wherein an outer surface of the first electrical conductor of the pluggable lead faces a different direction farther from the transistor die than closer to the transistor die, and wherein an outer surface of the second electrical conductor of the pluggable lead faces a different direction farther from the transistor die than closer to the transistor die.

8. The semiconductor package of claim 2, wherein the first electrical conductor of the pluggable lead is curved farther from the transistor die and flat closer to the transistor die, and wherein the second electrical conductor of the pluggable lead is curved farther from the transistor die and flat closer to the transistor die.

9. The semiconductor package of claim 2, wherein the first electrical conductor of the pluggable lead has a flat region on which the transistor die is disposed at a first side of the transistor die, and the first terminal of the transistor die is disposed at the first side of the transistor die and attached to the flat region of the first electrical conductor.

10. The semiconductor package of claim 9, wherein the second electrical conductor of the pluggable lead has a flat region spaced apart from the flat region of the first electrical conductor and from the transistor die, and the second terminal of the transistor die is disposed at a second side of the transistor die opposite the first side and electrically connected to the flat region of the second electrical conductor.

11. The semiconductor package of claim 10, wherein the second terminal of the transistor die is electrically connected to the flat region of the second electrical conductor by a metal clip or one or more bond wires.

12. The semiconductor package of claim 10, wherein the flat region of the second electrical conductor extends over and is attached to the second die terminal of the transistor die.

13. The semiconductor package of claim 2, wherein the second electrical conductor of the pluggable lead is partly disposed in and isolated from the first electrical conductor of the pluggable lead, and the third electrical conductor of the pluggable lead is partly disposed in and isolated from the second electrical conductor of the pluggable lead.

14. The semiconductor package of claim 13, wherein the second electrical conductor of the pluggable lead protrudes farther away from the transistor die than the first electrical conductor of the pluggable lead, and the third electrical conductor of the pluggable lead protrudes farther away from the transistor die than the second electrical conductor of the pluggable lead.

15. The semiconductor package of claim 14, wherein each of the electrical conductors of the pluggable lead has a distal end adjacent the transistor die, and wherein the distal end of each electrical conductor has the same width.

* * * * *